United States Patent [19]

Nakatani

[11] Patent Number: 4,503,350

[45] Date of Patent: Mar. 5, 1985

[54] PIEZOELECTRIC RESONATOR DEVICE WITH A LAMINATED STRUCTURE

[75] Inventor: Hiroshi Nakatani, Kanazawa, Japan

[73] Assignee: Murata Manufacturing Co., Ltd., Nagaokakyo, Japan

[21] Appl. No.: 568,508

[22] Filed: Jan. 4, 1984

[30] Foreign Application Priority Data

Jan. 18, 1983 [JP] Japan .................................. 58-7161

[51] Int. Cl.³ .......................................... H01L 41/08
[52] U.S. Cl. .................................... 310/321; 310/366; 310/368; 310/358; 333/186
[58] Field of Search ............... 310/321, 322, 324, 326, 310/327, 332, 358, 366–368; 333/186, 189

[56] References Cited

U.S. PATENT DOCUMENTS

| | | | |
|---|---|---|---|
| 3,174,122 | 3/1965 | Fowler | 310/321 X |
| 3,189,851 | 6/1965 | Fowler | 310/321 X |
| 3,321,648 | 5/1967 | Kolm | 310/321 |
| 3,421,109 | 1/1969 | Wiggins et al. | 310/366 X |

Primary Examiner—Mark O. Budd
Attorney, Agent, or Firm—Wenderoth, Lind & Ponack

[57] ABSTRACT

A piezoelectric resonator device with a laminated structure include two piezoelectric plates, each having opposite flat surfaces and polarized in a predetermined direction. Each piezoelectric plate is deposited with electrodes on its opposite flat surfaces, respectively. A junction layer of solder is rigidly held between the two piezoelectric plates for holding them together in a laminated structure. A weight ratio of the junction layer to a sum of two piezoelectric plates including their electrodes is selected to be between 0.5% and 5%.

11 Claims, 9 Drawing Figures

PIEZOELECTRIC RESONATOR DEVICE WITH A LAMINATED STRUCTURE

BACKGROUND OF THE INVENTION

1. Field of the Invention

The present invention relates to a piezoelectric resonator device defined by a plurality of piezoelectric plates polarized approximately in the same direction and assembled together in a laminated structure.

2. Description of the Prior Art

A piezoelectric resonator device with a laminated structure is known to vibrate in many different ways. For example, the vibrations may take place in the plane of the plate or in the thickness direction. The vibrations taking place in the plane of the plate are referred to as plane mode vibrations, which are also known as contour mode, expansion mode, lengthwise mode, widthwise mode, radial mode, and area mode. The vibrations taking place in the thickness direction are referred to as thickness mode vibrations.

When operating the piezoelectric resonator device under the plane mode vibrations, it also accompanies thickness mode vibrations as spurious responses, which are unwanted vibrations. Therefore, in order to obtain a preferable operation of the piezoelectric resonator device, it is necessary to eliminate or suppress the thickness mode vibrations.

To this end, according to the prior art, various methods are proposed. For example, in the case of a piezoelectric resonator device defined by a rectangular piezoelectric plate operated under expansion mode, the unwanted thickness mode vibrations (the spurious responses) are suppressed: (i) by the employment of a recess at the center of each side of the piezoelectric plate; or (ii) by the deposition of a mass, such as a solder layer, on an electrode formed on the piezoelectric plate.

But, the method (i) has such disadvantages that the employment of recesses results in reduction of strength characteristics and that the degree of suppress is very small. Also, the method (ii) has such a disadvantage that a pressure contact between the electrode deposited with the solder bead and a terminal member touching on this electrode becomes unstable such that the contact condition varies after a long term by the oxidization of solder bead, resulting in poor electric contact therebetween.

SUMMARY OF THE INVENTION

The present invention has been developed with a view to substantially solving the above described disadvantages and has for its essential object to provide an improved piezoelectric resonator device with a laminated structure which can suppress the unwanted spurious responses caused by thickness mode vibrations.

It is a further object of the present invention to provide piezoelectric resonator device with a laminated structure of the above described type which has a simple structure and can readily be manufactured at low cost.

In accomplishing these and other objects, a piezoelectric resonator device with a laminated structure according to the present invention comprises two piezoelectric plates, each having opposite flat surfaces and polarized in a predetermined direction. Each piezoelectric plate is deposited with electrodes on its opposite flat surfaces, respectively. A junction layer is rigidly held between the two piezoelectric plates for holding them together in a laminated structure. A weight ratio of the junction layer to a sum of two piezoelectric plates including their electrodes is selected to be between 0.5% and 5%.

BRIEF DESCRIPTION OF THE DRAWINGS

These and other objects and features of the present invention will become apparent from the following description taken in conjunction with preferred embodiments thereof with reference to the accompanying drawings, throughout which like parts are designated by like reference numerals, and in which.

DESCRIPTION OF THE PREFERRED EMBODIMENTS

Figure 1:
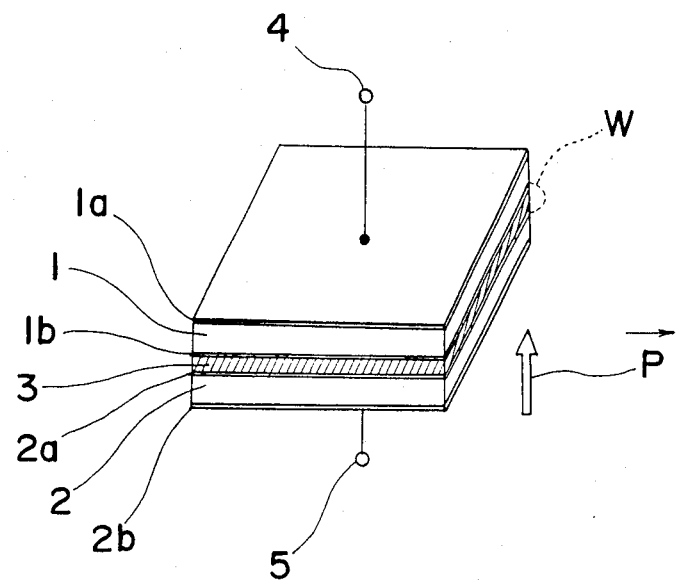
FIG. 1 is a perspective view of a piezoelectric resonator device with a laminated structure according to a first embodiment of the present invention.

Referring to FIG. 1, a piezoelectric resonator device with a laminated structure according to the present invention is shown. In FIG. 1, reference numbers 1 and 2 designate rectangular piezoelectric plates made of the same piezoelectric material, such as piezoelectric ceramic. A reference number 3 designates a junction layer, and 4 and 5 designate terminals for the external electric connection.

According to the embodiment shown, each of piezoelectric plates 1 and 2 has a square configuration with opposite flat surfaces. The piezoelectric plate 1 has electrodes 1a and 1b, made of silver (Ag), deposited on its opposite flat surfaces, respectively. Similarly, the piezoelectric plate 2 has electrodes 2a and 2b, made of silver (Ag), deposited on its opposite flat surfaces, respectively. The piezoelectric plate 1 is polarized in its thickness direction, i.e., in a direction approximately perpendicular to the opposite flat surfaces, from electrode 1b to electrode 1a, as indicated by an arrow $\vec{P}$. Similarly, piezoelectric plate 2 is polarized in its thickness direction from electrode 2b to electrode 2a, as indicated by an arrow $\vec{P}$.

The piezoelectric plates 1 and 2 are assembled fixedly together by junction layer 3 such that junction layer 3 is substantially held between electrodes 1b and 2a.

Junction layer 3 is provided to hold the piezoelectric plates 1 and 2 together and, therefore, from this point of view, it can be made of an adhesive material having an electric conductive property, such as solder or electric conductive bonding agent, or an adhesive material having no electric conductive property, such as epoxy resin. Since it is necessary to provide an electric connection between electrodes 1b and 2a, a suitable lead wire W, as shown by a dotted line, should be connected between electrodes 1b and 2a, when junction layer 3 is made of electrically non-conductive material.

As apparent from the above, the piezoelectric resonator device described above is a two-terminal type and operates under expansion mode.

According to the present invention, a weight ratio of junction layer 3 to piezoelectric plates 1 and 2 (including respective electrodes 1a, 1b, 2a and 2c) defining the piezoelectric resonator device shown in FIG. 1 should be selected to be between 0.5% and 5%.

Figure 2:
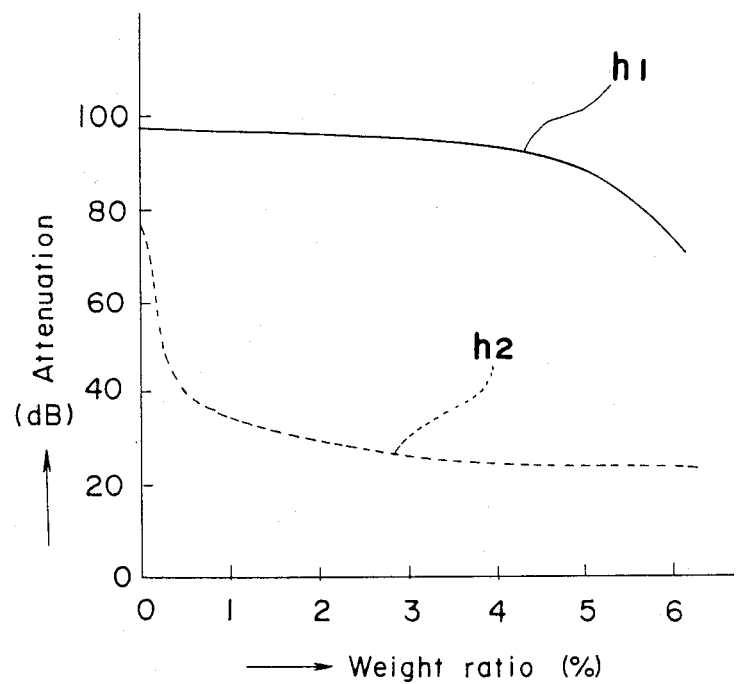
FIG. 2 is a graph showing a relationship between a weight ratio of a mass of a junction layer between piezoelectric resonator plates to a mass of piezoelectric resonator device itself and main response, and also a relationship between the above-mentioned weight ratio and spurious response.

The above given figures, i.e., between 0.5% and 5%, are determined in accordance with the tests carried out to obtain a relationship between the above given weight ratio and the attenuation of main response and a relationship between the weight ratio and the attenuation of spurious responses of thickness mode vibration. The result of the tests is shown in FIG. 2, in which a curve h1 represents in the case of main response and a curve h2 represents in the case of spurious response. As apparent from FIG. 2, the spurious response, shown by curve h2, is reduced when the weight ratio increases greater than 0.5%, and the main response, shown by curve h1, is reduced when the weight ratio increases greater than 5%. Therefore, a range for obtaining a high main response and low spurious responses is between 0.5% and 5%.

Figure 3:
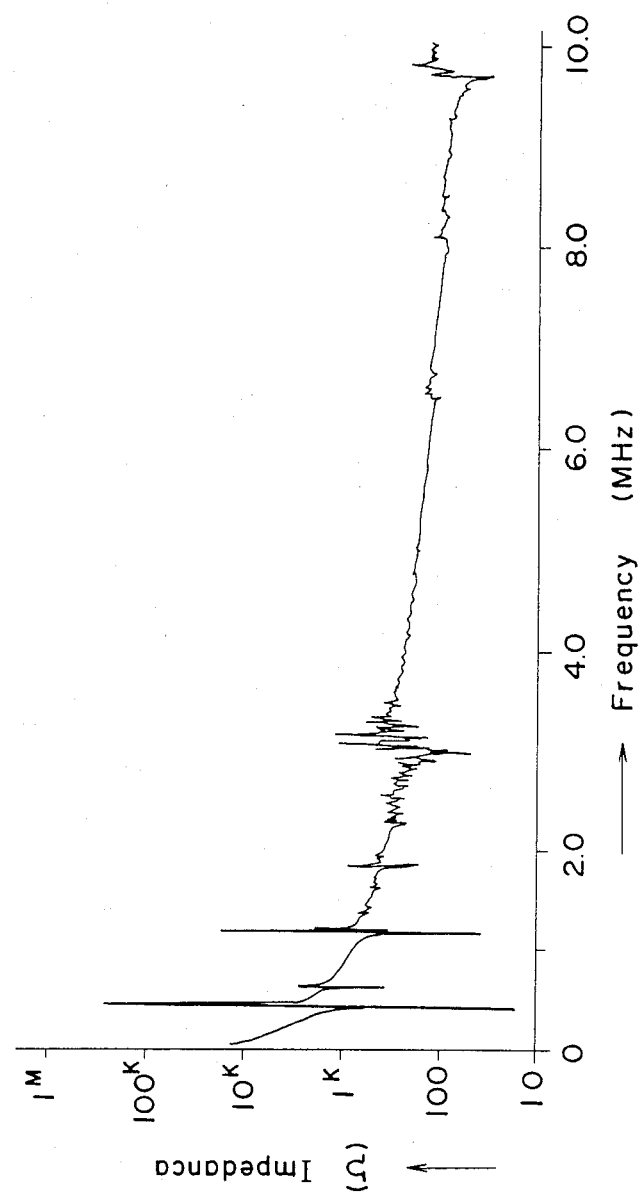
FIG. 3 is a graph showing a spurious characteristics of a piezoelectric resonator device according to FIG. 1.

Referring to FIG. 3, a spurious characteristics of a piezoelectric resonator device according to one embodiment of the present invention is shown. The piezoelectric resonator device used to obtain the spurious characteristics of FIG. 3 has such a specification that: each of electrodes 1a, 1b, 2a and 2b is made of silver film and has the thickness of 0.3 (mm); the material for junction layer 3 is solder; the weight ratio of junction layer 3 to the sum of piezoelectric plates 1 and 2 (including electrodes 1a, 1b, 2a and 2b) is selected to be about 2%; and the size of the piezoelectric resonator device is 4.85 (mm)×4.85 (mm)×0.66 (mm).

Figure 4:
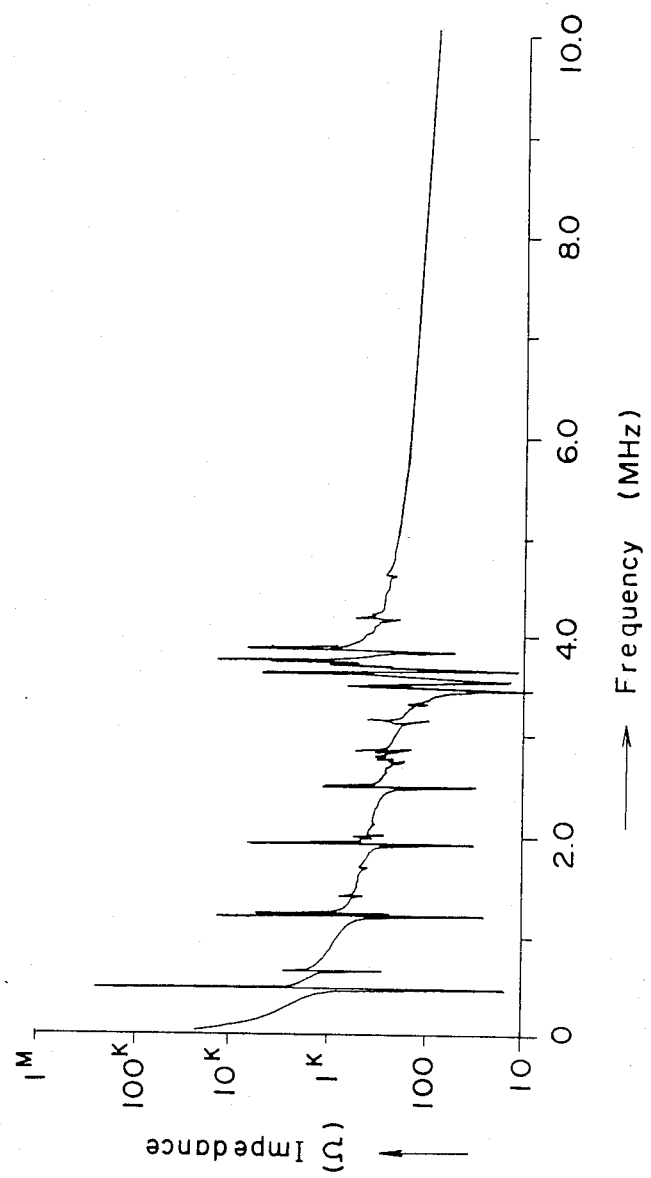
FIG. 4 is a graph showing a spurious characteristics of a piezoelectric resonator device according to the prior art.

In contrast to the above, a spurious characteristics of a piezoelectric resonator device according to the prior art is shown in FIG. 4. The prior art piezoelectric resonator device used to obtain the characteristics of FIG. 4 has the same size as given above, but the thickness of each electrode is made 0.06 (mm).

When the two graphs given in FIGS. 3 and 4 are compared with each other, it is understood that the spurious responses of thickness mode at a frequency region around 3.0 MHz appearing in the graph of FIG. 4 is much reduced in the graph of FIG. 3.

Figure 5:
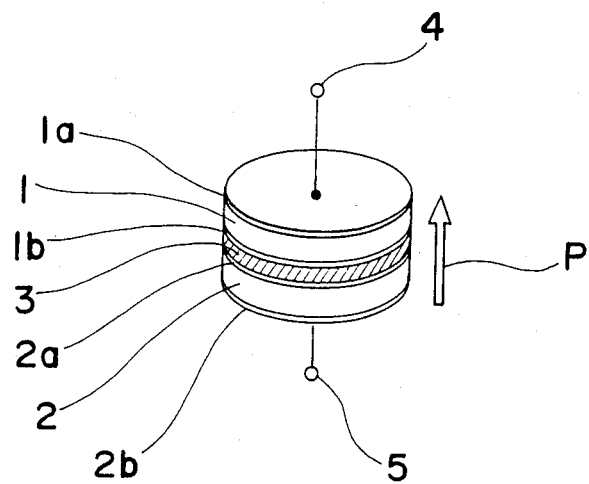

Referring to FIG. 5, a piezoelectric resonator device with a laminated structure according to a second embodiment of the present invention is shown. Instead of rectangular, the device is arranged in a circle. Thus, the piezoelectric resonator device of FIG. 5 operates under radial mode of vibration.

Figure 6:
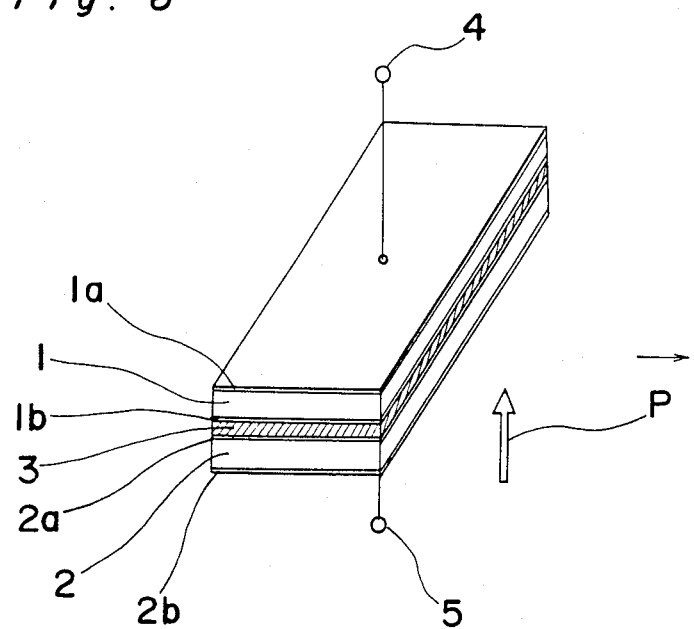

Referring to FIG. 6, a piezoelectric resonator device with a laminated structure according to a third embodiment of the present invention is shown. The device is arranged in an elongated rectangular shape. Thus, the piezoelectric resonator device of FIG. 5 operates under lengthwise mode of vibration, or widthwise mode of vibration.

Figure 7:
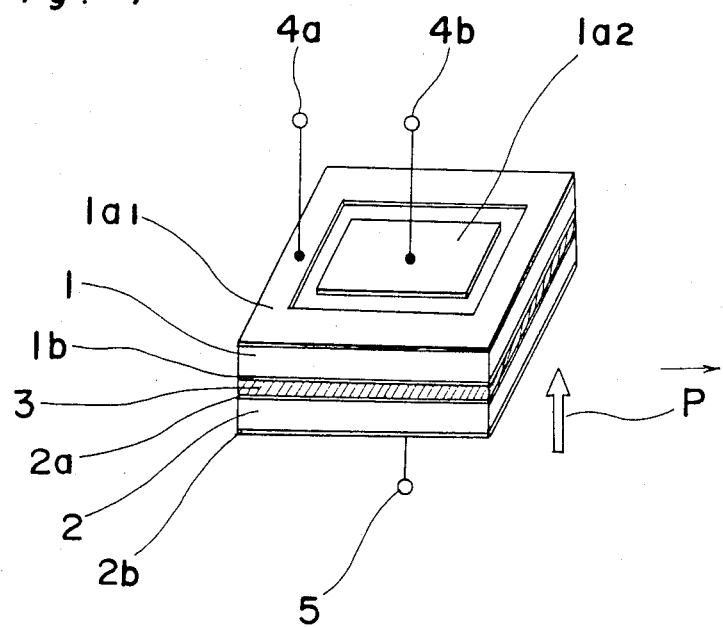
FIGS. 5, 6, 7, 8 and 9 are perspective views of piezoelectric resonator devices according to other embodiments of the present invention.

Referring to FIG. 7, a piezoelectric resonator device with a laminated structure according to a fourth embodiment of the present invention is shown. The deviced of the first, second and third embodiments described above are a two-terminal type, but the device of the fourth embodiment is a three-terminal type, as described below. The device of this embodiment has a square configuration similar to that shown in FIG. 1. The difference is that the electrode 1a of the piezoelectric plate 1 is electrically separated into a peripheral electrode $1a_1$ and a center electrode $1a_2$. The peripheral electrode $1a_1$ is connected to a terminal 4a and the center electrode $1a_2$ is connected to a terminal 4b for the external electric connection.

Figure 8:
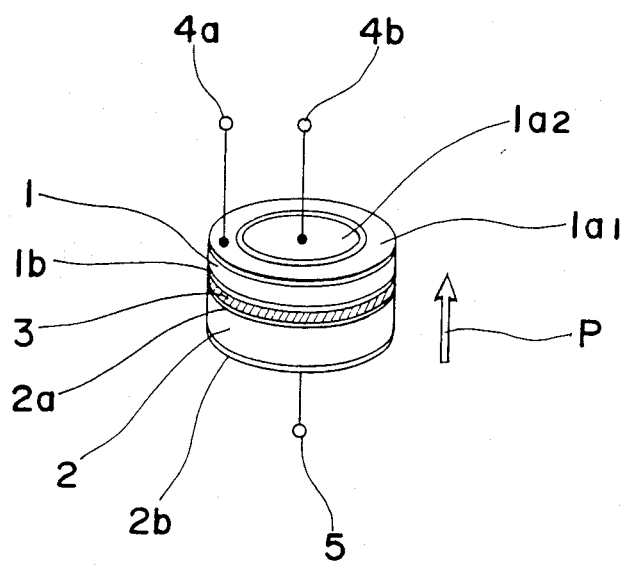

Referring to FIG. 8, a piezoelectric resonator device with a laminated structure according to a fifth embodiment of the present invention is shown. The device of this embodiment has a circle configuration similar to that shown in FIG. 5, but is a three-terminal type. Thus, the electrode 1a of the piezoelectric plate 1 is separated into a peripheral electrode $1a_1$ and a center electrode $1a_2$. The peripheral electrode $1a_1$ is connected to a terminal 4a and the center electrode $1a_2$ is connected to a terminal 4b for the external electric connection.

Figure 9:
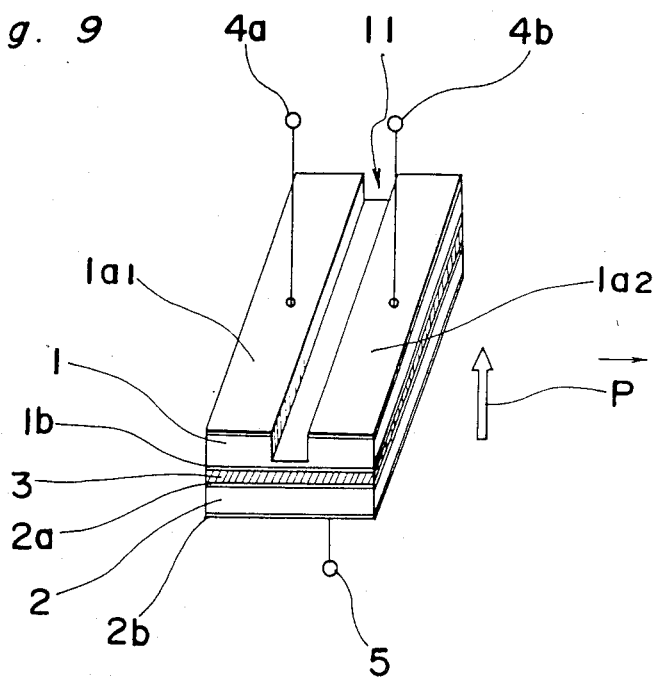

Referring to FIG. 9, a piezoelectric resonator device with a laminated structure according to a sixth embodiment of the present invention is shown. The device of this embodiment has a elongated rectangular configuration similar to that shown in FIG. 6, but is a three-terminal type. Unlike the embodiments shown in FIGS. 7 and 8, the electrode 1a of the piezoelectric plate 1 is separated into two parallel electrodes $1a_1$ and $1a_2$ by an elongated groove 11 which partly intrudes into the piezoelectric plate 1. The electrode $1a_1$ is connected to a terminal 4a and the electrode $1a_2$ is connected to a terminal 4b for the external electric connection.

It is to be noted that the piezoelectric resonator device of any one of FIGS. 5-9 is so arranged that the weight ratio of junction layer 3 to piezoelectric plates 1 and 2 (including electrodes 1a, 1b, 2a, 2b, $1a_1$ and $1a_2$) defining the piezoelectric resonator device is selected to be between 0.5% and 5%, thereby suppressing the spurious mode of thickness vibration.

Since the piezoelectric resonator device with a laminated structure according to the present invention suppresses the spurious mode from the view point of weight ratio, the disadvantages in suppressing the spurious mode in the prior art devices can be eliminated.

Although the present invention has been fully described with reference to several preferred embodiments, many modifications and variations thereof will now be apparent to those skilled in the art, and the scope of the present invention is therefore to be limited not by the details of the preferred embodiments described above, but only by the terms of appended claims.

What is claimed is:

1. A piezoelectric resonator device with a laminated structure comprising:
    at least first and second piezoelectric plates, each having opposite flat surfaces and polarized in a predetermined direction;
    first and second electrode means deposited on said opposite flat surfaces, respectively, of said first piezoelectric plate;
    third and fourth electrode means deposited on said opposite flat surfaces, respectively, of said second piezoelectric plate;
    a junction layer rigidly held between second and third electrodes for assembling said first and second piezoelectric plates together in a laminated structure; and
    connecting means for electrically connecting said second and third electrodes,
    a weight ratio of said junction layer to a sum of first and second piezoelectric plates and first, second, third and fourth electrode means being selected to be between 0.5% and 5%.

2. A piezoelectric resonator device as claimed in claim 1, wherein said first and second piezoelectric plates have a square configuration.

3. A piezoelectric resonator device as claimed in claim 2, wherein said first electrode means comprises a peripheral electrode and a center electrodes which are electrically separated from each other.

4. A piezoelectric resonator device as claimed in claim 1, wherein said first and second piezoelectric plates have a rectangular configuration.

5. A piezoelectric resonator device as claimed in claim 4, wherein said first electrode means comprises a peripheral electrode and a center electrodes which are electrically separated from each other.

6. A piezoelectric resonator device as claimed in claim 1, wherein said first and second piezoelectric plates have a circle configuration.

7. A piezoelectric resonator device as claimed in claim 6, wherein said first electrode means comprises a peripheral electrode and a center electrodes which are electrically separated from each other.

8. A piezoelectric resonator device as claimed in claim 4, wherein said first electrode means comprises two parallel electrodes aligned side by side and electrically separated from each other by a groove which partly intrudes into said first piezoelectric plate.

9. A piezoelectric resonator device as claimed in claim 1, wherein said junction layer is formed by solder.

10. A piezoelectric resonator device as claimed in claim 1, wherein said junction layer is formed by an electric non-conductive adhesive material chosen from epoxy resin group.

11. A piezoelectric resonator device as claimed in claim 1, wherein said junction layer is formed by an electric conductive adhesive material.

* * * * *